United States Patent
Li et al.

(10) Patent No.: US 9,892,791 B2
(45) Date of Patent: Feb. 13, 2018

(54) FAST SCAN TO DETECT BIT LINE DISCHARGE TIME

(71) Applicant: SANDISK TECHNOLOGIES INC., Plano, TX (US)

(72) Inventors: Yen-Lung Li, San Jose, CA (US); Jong Yuh, Pleasanton, CA (US); Jonathan Huynh, San Jose, CA (US); Tai-Yuan Tseng, Milpitas, CA (US); Kwang-Ho Kim, Pleasanton, CA (US); Qui Nguyen, San Jose, CA (US)

(73) Assignee: SANDISK TECHNOLOGIES LLC, Plano, TX (US)

(*) Notice: Subject to any disclaimer, the term of this patent is extended or adjusted under 35 U.S.C. 154(b) by 0 days.

(21) Appl. No.: 15/184,939

(22) Filed: Jun. 16, 2016

(65) Prior Publication Data
US 2016/0372200 A1 Dec. 22, 2016

Related U.S. Application Data

(60) Provisional application No. 62/180,061, filed on Jun. 16, 2015.

(51) Int. Cl.
| | |
|---|---|
| *G11C 16/08* | (2006.01) |
| *G11C 16/26* | (2006.01) |
| *G11C 16/34* | (2006.01) |
| *G11C 7/04* | (2006.01) |
| *G11C 16/04* | (2006.01) |

(52) U.S. Cl.
CPC ........... *G11C 16/08* (2013.01); *G11C 7/04* (2013.01); *G11C 16/26* (2013.01); *G11C 16/3459* (2013.01); *G11C 16/0483* (2013.01)

(58) Field of Classification Search
CPC ..... G11C 16/08; G11C 16/26; G11C 16/3459; G11C 16/0483; G11C 7/04
USPC ............................ 365/185.17, 185.11, 185.21
See application file for complete search history.

(56) References Cited

U.S. PATENT DOCUMENTS

| | | | | |
|---|---|---|---|---|
| 5,151,906 A | * | 9/1992 | Sawada ............... | G06F 11/1008 714/718 |
| 5,187,392 A | * | 2/1993 | Allen ............... | H03K 19/17704 326/23 |
| 5,636,168 A | * | 6/1997 | Oyama .................. | G11C 29/52 365/185.3 |
| 5,748,545 A | * | 5/1998 | Lee ........................ | G11C 29/02 365/189.11 |

(Continued)

*Primary Examiner* — Vu Le
*Assistant Examiner* — Sung Cho
(74) *Attorney, Agent, or Firm* — Vierra Magen Marcus LLP

(57) ABSTRACT

Systems and methods for reducing sensing time for sensing data states stored within a plurality of memory cells are described. In some cases, the ramping of a word line connected to the plurality of memory cells may be delayed until a threshold current corresponding with a particular number of erased memory cells of the plurality of memory cells has been met or exceeded. The threshold current may be compared with a summation of a first set of detection currents corresponding with a first set of memory cells of the plurality of memory cells that have been sensed to be in a conducting state while the word line is set to a voltage level for sensing erased memory cells. The threshold current may be set based on a chip temperature and/or a particular number of bit errors that occurred during a prior sensing operation.

21 Claims, 11 Drawing Sheets

(56) References Cited

U.S. PATENT DOCUMENTS

| | | | | |
|---|---|---|---|---|
| 5,978,275 | A * | 11/1999 | Song | G11C 16/10 365/185.11 |
| 6,201,747 | B1 * | 3/2001 | Venkatesh | G11C 29/50 365/185.24 |
| 6,714,457 | B1 * | 3/2004 | Hsu | G11C 11/5628 365/185.03 |
| 7,177,183 | B2 * | 2/2007 | Scheuerlein | G11C 8/10 365/185.02 |
| 7,813,181 | B2 | 10/2010 | Cernea | |
| 8,520,441 | B2 | 8/2013 | Yuh | |
| 9,704,581 | B2 * | 7/2017 | Guo | G11C 16/06 |
| 2006/0092703 | A1 * | 5/2006 | Chae | G11C 16/10 365/185.18 |
| 2007/0023808 | A1 * | 2/2007 | Specht | G11C 16/0475 257/296 |
| 2007/0263453 | A1 * | 11/2007 | Tanzawa | G11C 7/04 365/185.23 |
| 2008/0074152 | A1 * | 3/2008 | Pratlong | G11C 7/062 327/55 |
| 2008/0304325 | A1 * | 12/2008 | Mokhlesi | G11C 7/12 365/185.21 |
| 2009/0034338 | A1 * | 2/2009 | Lin | G11C 16/28 365/185.21 |
| 2009/0052256 | A1 * | 2/2009 | Sutardja | G11C 8/08 365/185.19 |
| 2009/0161433 | A1 * | 6/2009 | Lee | G11C 16/30 365/185.12 |
| 2009/0268509 | A1 * | 10/2009 | Maejima | G11C 5/02 365/148 |
| 2009/0273964 | A1 * | 11/2009 | Yamazaki | G11C 13/0007 365/148 |
| 2010/0074015 | A1 * | 3/2010 | Chandrasekhar | G11C 11/5642 365/185.17 |
| 2011/0222353 | A1 * | 9/2011 | Pabustan | G11C 16/26 365/185.19 |
| 2012/0300561 | A1 * | 11/2012 | Yun | G11C 5/025 365/189.09 |
| 2013/0336066 | A1 * | 12/2013 | Tercariol | G11C 16/28 365/185.18 |
| 2014/0269094 | A1 * | 9/2014 | Maeda | G11C 16/26 365/185.21 |
| 2015/0078097 | A1 * | 3/2015 | Yano | G11C 16/14 365/185.25 |

* cited by examiner

FAST SCAN TO DETECT BIT LINE DISCHARGE TIME

CLAIM OF PRIORITY

The present application claims priority to U.S. Provisional Application No. 62/180,061, entitled "Fast Scan to Detect Bit Line Discharge Time," filed Jun. 16, 2015, which is herein incorporated by reference in its entirety.

BACKGROUND

Semiconductor memory is widely used in various electronic devices such as cellular telephones, digital cameras, personal digital assistants, medical electronics, mobile computing devices, and non-mobile computing devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

Both flash memory and EEPROM utilize floating-gate transistors. For each floating-gate transistor, a floating gate is positioned above and insulated from a channel region of the floating-gate transistor. The channel region is positioned between source and drain regions of the floating-gate transistor. A control gate is positioned above and insulated from the floating gate. The threshold voltage of the floating-gate transistor may be controlled by setting the amount of charge stored on the floating gate. The amount of charge on the floating gate is typically controlled using Fowler-Nordheim (F-N) tunneling or hot-electron injection. The ability to adjust the threshold voltage allows a floating-gate transistor to act as a non-volatile storage element or memory cell. In some cases, more than one data bit per memory cell (i.e., a multi-level or multi-state memory cell) may be provided by programming and reading multiple threshold voltages or threshold voltage ranges.

NAND flash memory structures typically arrange multiple floating-gate transistors in series with and between two select gates. The floating-gate transistors in series and the select gates may be referred to as a NAND string. In recent years, NAND flash memory has been scaled in order to reduce cost per bit. However, as process geometries shrink, many design and process challenges are presented. These challenges include increased variability in transistor characteristics over process, voltage, and temperature variations.

DETAILED DESCRIPTION

Figure 1:
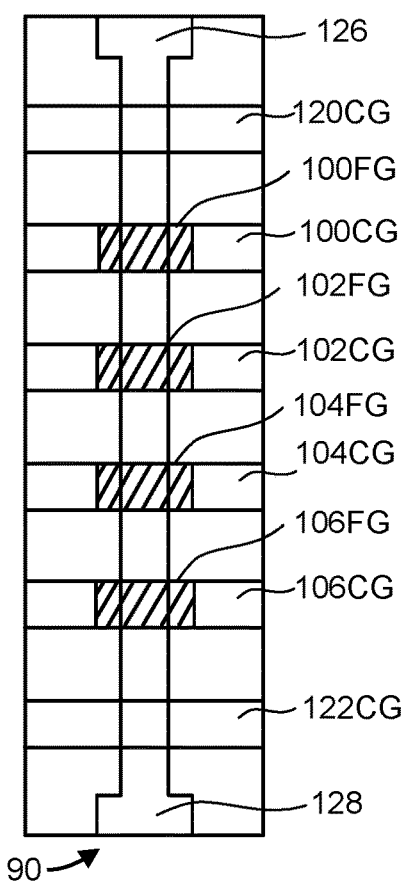
FIG. 1 depicts one embodiment of a NAND string.

Technology is described for reducing sensing time for determining or verifying data states stored within a plurality of memory cells. In some embodiments, the ramping of a word line connected to the plurality of memory cells may be delayed until a threshold current corresponding with a particular number of erased memory cells of the plurality of memory cells has been met or exceeded. The threshold current may be compared with an aggregation of a first set of detection currents corresponding with a first set of memory cells of the plurality of memory cells that have been sensed to be in a conducting state while the word line is set to a voltage level for sensing erased memory cells (e.g., 0V). In some cases, the threshold current may be set based on a chip temperature. For example, if the chip temperature is greater than a temperature threshold (e.g., is above 85 degrees Celsius), then the threshold current may be set to 2 mA; however, if the chip temperature is not greater than the temperature threshold, then the threshold current may be set to 500 µA. The threshold current may also be set based on whether a particular number of bit errors occurred during a prior sensing operation. For example, if during a prior sensing operation the number of bit errors was greater than a threshold number of bit errors (e.g., greater than three bit errors), then the threshold current may be set to 1 mA; however, if during the prior sensing operation the number of bit errors was not greater than the threshold number of bit errors, then the threshold current may be set to 300 µA.

Memory performance may be improved by determining a bit line discharge time or by determining when a particular number of erased memory cells have been sensed as being in a conducting state (e.g., sense amplifier have sensed or detected that the erased memory cells are in a conducting state during a page read). The bit line discharge time may depend on bit line resistance, bit line capacitance, and memory cell currents, which may vary over time based on voltage and temperature variations. After the bit line discharge time has passed since initiation of a sensing operation or after it has been determined that a particular number of erased memory cells have been sensed as conducting since initiation of the sensing operation, then the sensing of other data states may be performed. The sensing of the other data states may be performed by initiating ramping of a word line voltage being applied to memory cells or by increasing the word line voltage being applied to the memory cells (e.g., via step sensing or ramp sensing). In one example, during a page read (e.g., of a 1 KB or 2 KB page), a threshold current corresponding with a number of conducting memory cells (e.g., 16 memory cells or 32 memory cells) may be compared with a summation of a first set of detection currents corresponding with a first set of memory cells that have been determined to be in a conducting state. In this case, the ramping of a word line from a first voltage to a second voltage greater than the first voltage may be initiated in response to detecting that the summation of the first set of detection currents has exceeded the threshold current. Due to the distribution of data states within a page, there should be some number of memory cells that are set into the erased state.

In one embodiment, a sense amplifier may include an internal node (e.g., the LAT node) that transitions (e.g., from a low voltage to a high voltage) when a bit line connected to a memory cell being sensed by the sense amplifier falls below a voltage threshold or satisfies a trip point for the sense amplifier. Once the internal node transitions, a detection current for the sense amplifier may be enabled and aggregated with other detection currents from other sense amplifiers. In one example, the detection current for each sense amplifier may comprise 2 µA of current and a threshold current to which the aggregation of sense amplifier detection currents is compared may comprise 32 µA.

In some embodiments, while sense amplifier circuits are sensing currents through selected memory cells, scan paths within the sense amplifier circuits may be utilized to detect when at least a particular number of the plurality of bit lines have been discharged by at least a threshold amount or to detect when at least a particular number of the selected memory cells are in a conducting state. In one example, parallel detection of bit line discharge times across bit lines connected to 4K or 8K sense amplifiers may be performed. In another example, bit line discharge times may be evaluated by summing a plurality of bit line currents associated with a plurality of bit lines and then comparing the combined bit line currents with a threshold current.

With ramp sensing, a word line of a memory array may be ramped up linearly and a sensing operation may be performed by the sense amplifier while the word line is continuously being ramped up. In this case, during the sensing operation, the sense amplifier may sense a bit line of the memory array connected to a memory cell while the word line is ramping up and then transfer the result (e.g., based on the SEN level of the sense amplifier) into a data latch. In contrast, with conventional step sensing, a bit line of the memory array may be first precharged to a particular voltage level (e.g., a read voltage level) and then sensed while the word line is held at the particular voltage level. In this case, the word line may first settle at the particular voltage level prior to the sensing operation and then the sense amplifier may perform the sensing operation while the word line remains at the particular voltage level.

The methods and systems described herein may be used for sensing memory cells within a non-volatile storage system. The data states of memory cells may be sensed during a read operation or a program verify operation. In one embodiment, a non-volatile storage system may include one or more two-dimensional arrays of non-volatile memory cells. The memory cells within a two-dimensional memory array may form a single layer of memory cells and may be selected via control lines (e.g., word lines and bit lines) in the X and Y directions. In another embodiment, a non-volatile storage system may include one or more monolithic three-dimensional memory arrays in which two or more layers of memory cells may be formed above a single substrate without any intervening substrates. In some cases, a three-dimensional memory array may include one or more vertical columns of memory cells located above and orthogonal to a substrate or substantially orthogonal to the substrate (e.g., within 2-5 degrees of a normal vector that is orthogonal to the substrate). In one example, a non-volatile storage system may include a memory array with vertical bit lines or bit lines that are arranged orthogonal to a semiconductor substrate. The substrate may comprise a silicon substrate. The memory array may comprise various memory structures including planar NAND structures, vertical NAND structures, Bit Cost Scalable (BiCS) NAND structures, 3D NAND structures, or 3D ReRAM structures.

In one embodiment, the memory cells within a memory array may comprise re-writable non-volatile memory cells including a reversible resistance-switching element. A reversible resistance-switching element may include a reversible resistivity-switching material having a resistivity that may be reversibly switched between two or more states. In one embodiment, the reversible resistance-switching material may include a metal oxide (e.g., a binary metal oxide). The metal oxide may include nickel oxide or hafnium oxide. In another embodiment, the reversible resistance-switching material may include a phase change material. The phase change material may include a chalcogenide material. In some cases, the re-writeable non-volatile memory cells may comprise resistive RAM (ReRAM) memory cells. In other cases, the re-writeable non-volatile memory cells may comprise conductive bridge memory cells or programmable metallization memory cells.

In some embodiments, a non-volatile storage system may include a non-volatile memory that is monolithically formed in one or more physical levels of arrays of memory cells having an active area disposed above a silicon substrate. The non-volatile storage system may also include circuitry associated with the operation of the memory cells (e.g., decoders, state machines, page registers, or control circuitry for controlling the reading or programming of the memory cells). The circuitry associated with the operation of the memory cells may be located above the substrate or located within the substrate.

In some embodiments, a non-volatile storage system may include a monolithic three-dimensional memory array. The monolithic three-dimensional memory array may include one or more levels of memory cells. Each memory cell within a first level of the one or more levels of memory cells may include an active area that is located above a substrate (e.g., above a single-crystal substrate or a crystalline silicon substrate). In one example, the active area may include a semiconductor junction (e.g., a P-N junction). The active area may include a portion of a source or drain region of a transistor. In another example, the active area may include a channel region of a transistor.

Figure 2:
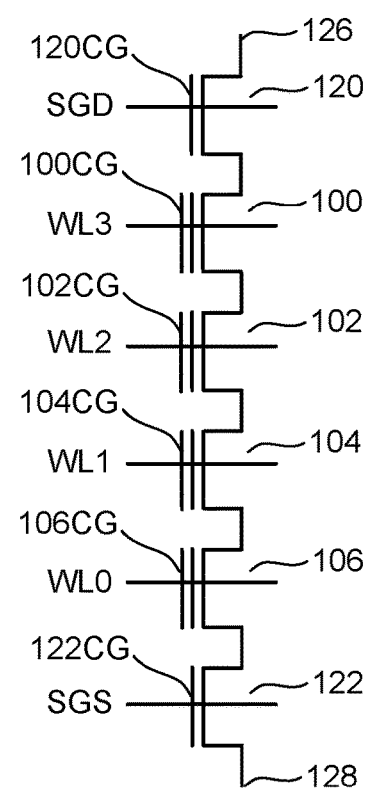
FIG. 2 depicts one embodiment of the NAND string of FIG. 1 using a corresponding circuit diagram.

FIG. 1 depicts one embodiment of a NAND string 90. FIG. 2 depicts one embodiment of the NAND string of FIG. 1 using a corresponding circuit diagram. As depicted, NAND string 90 includes four transistors, 100, 102, 104, and 106, in series between a first select gate 120 (i.e., a drain-side select gate) and a second select gate 122 (i.e., a source-side select gate). Select gate 120 connects the NAND string 90 to a bit line 126. Select gate 122 connects the NAND string 90 to a source line 128. Select gate 120 is controlled by applying the appropriate voltage to control gate 120CG (i.e., via select line SGD of FIG. 2). Select gate 122 is controlled by applying the appropriate voltage to control gate 122CG (i.e., via select line SGS of FIG. 2). Each of the transistors 100, 102, 104, and 106 includes a control gate and a floating gate. For example, transistor 100 includes control gate 100CG and floating gate 100FG, transistor 102 includes control gate 102CG and floating gate 102FG, transistor 104 includes control gate 104CG and floating gate 104FG, and transistor 106 includes control gate 106CG and floating gate 106FG. Control gates 100CG, 102CG, 104CG, and 106CG are connected to word lines WL3, WL2, WL1, and WL0, respectively.

Note that although FIGS. 1 and 2 show four floating-gate transistors in the NAND string, the use of four floating-gate transistors is only provided as an example. A NAND string may have less than or more than four floating-gate transistors (or memory cells). For example, some NAND strings may include 16 memory cells, 32 memory cells, 64 memory cells, 128 memory cells, etc. The discussion herein is not limited to any particular number of memory cells in a NAND string. One embodiment uses NAND strings with 66 memory cells, where 64 memory cells are used to store data and two of the memory cells are referred to as dummy memory cells because they do not store data.

A typical architecture for a flash memory system using a NAND flash memory structure includes a plurality of NAND strings within a memory block. A memory block may comprise a unit of erase. In some cases, the NAND strings within a memory block may share a common well (e.g., a P-well). Each NAND string may be connected to a common source line by its source-side select gate (e.g., controlled by select line SGS) and connected to its associated bit line by its drain-side select gate (e.g., controlled by select line SGD). Typically, each bit line runs on top of (or over) its associated NAND string in a direction perpendicular to the word lines and is connected to a sense amplifier.

In some embodiments, during a programming operation, storage elements that are not to be programmed (e.g., storage elements that have previously completed programming to a target data state) may be inhibited or locked out from programming by boosting associated channel regions (e.g., self-boosting the channel regions via word line coupling). An unselected storage element (or unselected NAND string) may be referred to as an inhibited or locked out storage element (or inhibited NAND string) as it is inhibited or locked out from programming during a given programming iteration of a programming operation.

Although technology using NAND-type flash memory may be described herein, the technology disclosed herein may also be applied to other types of non-volatile storage devices and architectures (e.g., NOR-type flash memory). Moreover, although technology using floating-gate transistors is described herein, the technology described herein may also be applied to or used with other memory technologies including those that employ charge trapping, phase-change (e.g., chalcogenide materials), or state-change materials.

Figure 3A:
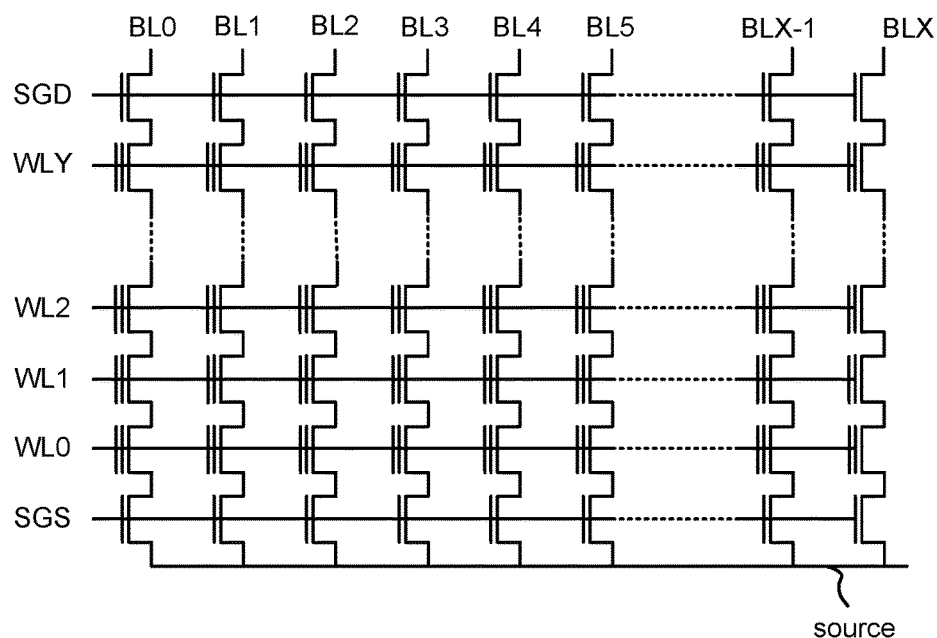
FIG. 3A depicts one embodiment of a memory block including a plurality of NAND strings.

FIG. 3A depicts one embodiment of a memory block including a plurality of NAND strings. As depicted, each NAND string includes (Y+1) memory cells. Each NAND string is connected to one bit line out of (X+1) bit lines on the drain side (i.e., one bit line of bit lines BL0-BLX) via a drain-side select gate controlled by the drain-side selection signal SGD. Each NAND string is connected to a source line (source) via a source-side select gate controlled by source-side selection signal SGS. In one embodiment, the source-side select gate controlled by source-side selection signal SGS and the drain-side select gate controlled by the drain-side selection signal SGD may comprise transistors without floating gates or transistors that include a floating gate structure.

In one embodiment, during a programming operation, when programming a memory cell, such as a NAND flash memory cell, a program voltage may be applied to the control gate of the memory cell and the corresponding bit line may be grounded. These programming bias conditions may cause electrons to be injected into the floating gate via field-assisted electron tunneling, thereby raising the threshold voltage of the memory cell. The program voltage applied to the control gate during a program operation may be applied as a series of pulses. In some cases, the magnitude of the programming pulses may be increased with each successive pulse by a predetermined step size. Between programming pulses, one or more verify operations may be performed. During the programming operation, memory cells that have reached their intended programming states may be locked out and inhibited from programming by boosting the channel regions of the program inhibited memory cells.

In one embodiment, memory cells may be erased by raising the p-well to an erase voltage (e.g., 20 volts) for a sufficient period of time and grounding the word lines of a selected block of memory cells while the source and bit lines are floating. These erase bias conditions may cause electrons to be transferred from the floating gate through the tunneling oxide, thereby lowering the threshold voltage of the memory cells within the selected block. In some cases, an erase operation may be performed on an entire memory plane, on individual blocks within a memory plane, or another unit of memory cells.

In some embodiments, during verify operations and/or read operations, a selected word line may be connected (or biased) to a voltage, a level of which is specified for each read and verify operation in order to determine whether a threshold voltage of a particular memory cell has reached such level. After applying the word line voltage, the conduction current of the memory cell may be measured (or sensed) to determine whether the memory cell conducted a sufficient amount of current in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell.

There are many ways to measure the conduction current of a memory cell during a read or verify operation. In one example, the conduction current of a memory cell may be measured by the rate it discharges or charges a dedicated capacitor in a sense amplifier. In another example, the conduction current of the selected memory cell allows (or fails to allow) the NAND string that included the memory cell to discharge a voltage on the corresponding bit line. The voltage of the bit line (or the voltage across a dedicated capacitor in a sense amplifier) may be measured after a period of time to determine whether the bit line has been discharged by a particular amount or not.

Figure 3B:
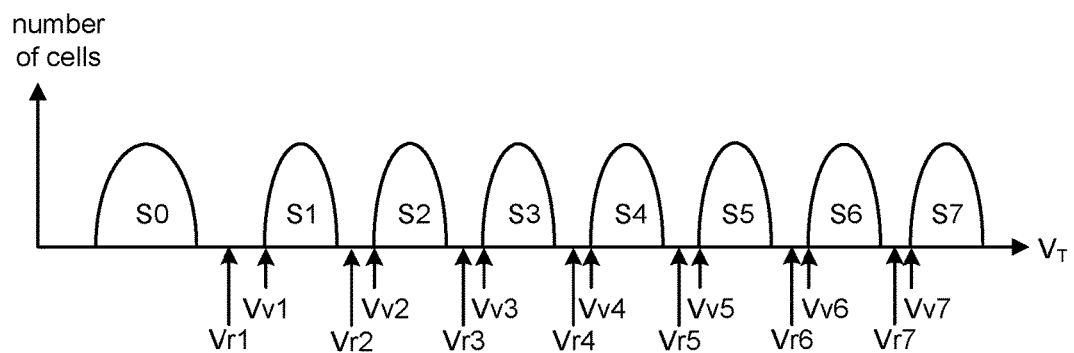
FIG. 3B depicts one embodiment of possible threshold voltage distributions for a three-bit-per-cell memory cell.

FIG. 3B depicts one embodiment of possible threshold voltage distributions (or data states) for a three-bit-per-cell memory cell (i.e., the memory cell may store three bits of data). Other embodiments, however, may use more than or less than three bits of data per memory cell (e.g., such as four or more bits of data per memory cell). At the end of a successful programming process (with verification), the threshold voltages of memory cells within a memory page or memory block should be within one or more threshold voltage distributions for programmed memory cells or within a distribution of threshold voltages for erased memory cells, as appropriate.

As depicted, each memory cell may store three bits of data; therefore, there are eight valid data states S0-S7. In one embodiment, data state S0 is below 0 volts and data states S1-S7 are above 0 volts. In other embodiments, all eight data states are above 0 volts, or other arrangements can be implemented. In one embodiment, the threshold voltage distribution S0 is wider than distributions S1-S7.

Each data state S0-S7 corresponds to a unique value for the three bits stored in the memory cell. In one embodiment, S0=111, S1=110, S2=101, S3=100, S4=011, S5=010, S6=001 and S7=000. Other mappings of data to states S0-S7 can also be used. In one embodiment, all of the bits of data stored in a memory cell are stored in the same logical page. In other embodiments, each bit of data stored in a memory cell corresponds to different pages. Thus, a memory cell storing three bits of data would include data in a first page, a second page, and a third page. In some embodiments, all of the memory cells connected to the same word line would store data in the same three pages of data. In some embodiments, the memory cells connected to a word line can be grouped into different sets of pages (e.g., by odd and even bit lines).

In some example implementations, the memory cells will be erased to state S0. From state S0, the memory cells can be programmed to any of states S1-S7. Programming may be performed by applying a set of pulses with rising magnitudes to the control gates of the memory cells. Between pulses, a set of verify operations may be performed to determine whether the memory cells being programmed have reached their target threshold voltage (e.g., using verify levels Vv1, Vv2, Vv3, Vv4, Vv5, Vv6, and Vv7). Memory cells being programmed to state S1 will be tested to see if their threshold voltage has reached Vv1. Memory cells being programmed to state S2 will be tested to see if their threshold voltage has reached Vv2. Memory cells being programmed to state S3 will be tested to see if their threshold voltage has reached Vv3. Memory cells being programmed to state S4 will be tested to see if their threshold voltage has reached Vv4. Memory cells being programmed to state S5 will be tested to see if their threshold voltage has reached Vv5. Memory cells being programmed to state S6 will be tested to see if their threshold voltage has reached Vv6. Memory cells being programmed to state S7 will be tested to see if their threshold voltage has reached Vv7.

When reading memory cells that store three bits of data, multiple reads will be performed at read compare points Vr1, Vr2, Vr3, Vr4, Vr5, Vr6, and Vr7 to determine which state the memory cells are in. If a memory cell turns on in response to Vr1, then it is in state S0. If a memory cell turns on in response to Vr2 but does not turn on in response to Vr1, then it is in state S1. If a memory cell turns on in response to Vr3 but does not turn on in response to Vr2, then it is in state S2. If a memory cell turns on in response to Vr4 but does not turn on in response to Vr3, then it is in state S3. If a memory cell turns on in response to Vr5 but does not turn on in response to Vr4, then it is in state S4. If a memory cell turns on in response to Vr6 but does not turn on in response to Vr5, then it is in state S5. If a memory cell turns on in response to Vr7 but does not turn on in response to Vr6, then it is in state S6. If a memory cell does not turn on in response to Vr7, then it is in state S7.

Figure 3C:
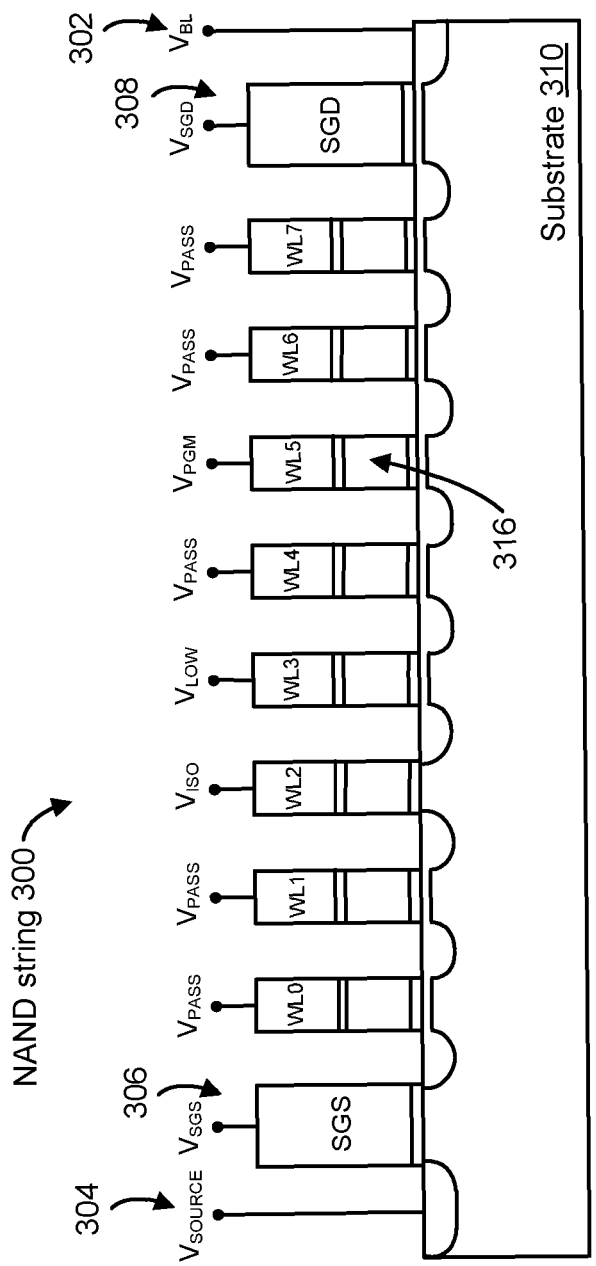
FIG. 3C depicts one embodiment of a NAND string during a programming operation.

FIG. 3C depicts one embodiment of a NAND string 300 during a programming operation. When programming a storage element (e.g., the storage element 316 associated with WL5) of the NAND string 300, a programming voltage may be applied to the selected word line associated with the storage element and a low voltage (e.g., ground) may be applied to the bit line associated with the storage element. As depicted, the NAND string 300 includes a source-side select gate 306, a drain-side select gate 308, and eight word lines WL0-WL7 formed above a substrate 310. $V_{SGS}$ may be applied to the source-side select gate 306 and $V_{SGD}$ may be applied to the drain-side select gate 308. The bit line 302 may be biased to $V_{BL}$ and the source line 304 may be biased to $V_{SOURCE}$. During a programming operation, a programming voltage, $V_{PGM}$, may be applied to selected word line WL5, which is associated with a selected storage element 316.

In one example of a boosting mode, when storage element 316 is the selected storage element, a relatively low voltage, $V_{LOW}$ (e.g., 2-6V) may be applied to a source-side word line (WL3), while an isolation voltage, $V_{ISO}$ (e.g., 0-4V) may be applied to another source-side word line (WL2), referred to as an isolation word line and a pass voltage, $V_{PASS}$, may be applied to the remaining word lines associated with NAND string 300 (in this case word lines WL0, WL1, WL4, WL6, and WL7). While the absolute values of $V_{ISO}$ and $V_{LOW}$ may vary over a relatively large and partly overlapping range, $V_{ISO}$ may be less than $V_{LOW}$. In some cases, $V_{ISO}$ may be less than $V_{LOW}$ which is less than $V_{PASS}$ which is less than $V_{PGM}$.

In some cases, a vertical NAND structure may comprise a vertical NAND string or a vertical inverted NAND string. A NAND string may comprise a string of floating gate transistors. An inverted NAND string may comprise a string of inverted floating gate transistors.

Figure 4A:
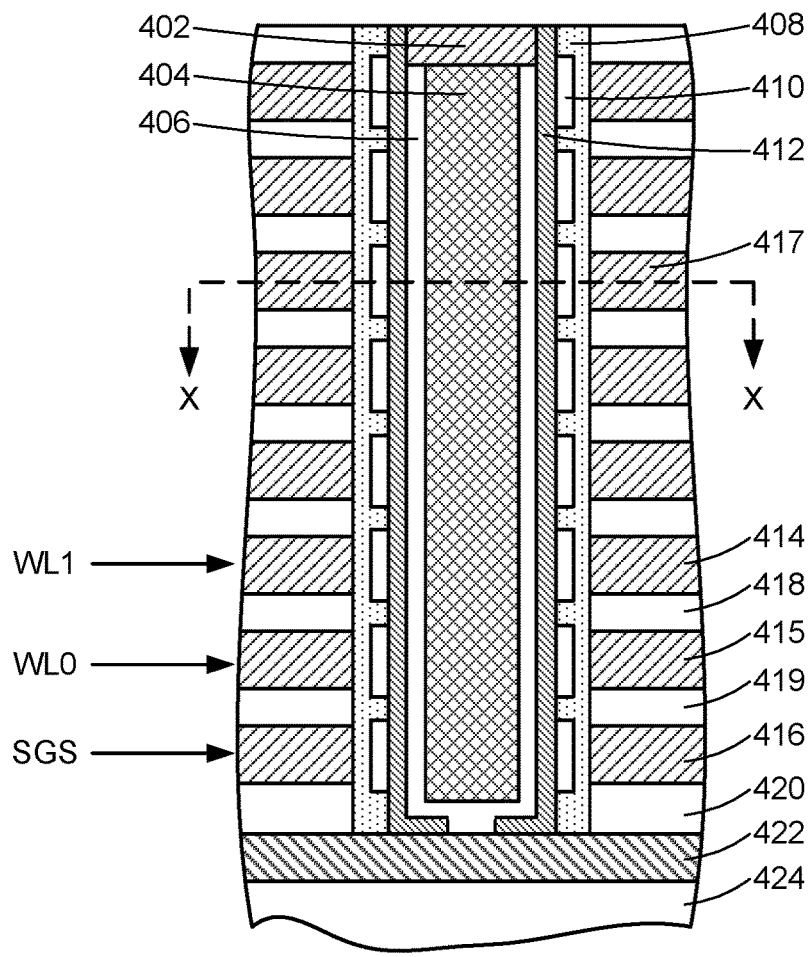
FIG. 4A depicts one embodiment of a vertical NAND structure.

FIG. 4A depicts one embodiment of a vertical NAND structure. The vertical NAND structure includes an inverted NAND string formed above the substrate 424 and oriented such that the inverted NAND string is orthogonal to the substrate 424. An inverted NAND string may comprise a NAND string that includes an inverted floating gate transistor with a tunneling oxide between a floating gate of the inverted floating gate transistor and a control gate of the inverted floating gate transistor. The arrangement of the tunneling oxide between the floating gate and the control gate allows the mechanism (e.g., F-N tunneling as the transport mechanism) for programming and/or erase of the inverted floating gate transistor to occur between the floating gate and the control gate rather than between the floating gate and the channel of the inverted floating gate transistor. The inverted NAND string may be arranged within a vertical memory hole that is etched through alternating layers of control gate material (e.g., tungsten, nitride, or polysilicon) and inter-gate insulator material (e.g., oxide or silicon dioxide). As depicted, the layers of control gate material include layer 417 and layers 414-416 and the layers of inter-gate insulator material include layers 418-420. The inter-gate insulator material layer 420 may be arranged above a source line layer 422 (e.g., doped polysilicon) that may be arranged above a substrate 424 (e.g., a silicon substrate). In some cases, a first word line (WL1) may correspond with control gate layer 414, a second word line (WL0) may correspond with control gate layer 415, and a source-side select gate line (SGS) may correspond with control gate layer 416.

In one embodiment, within the memory hole a tunneling layer material 408 (e.g., including a thin oxide), a floating gate material 410 (e.g., polysilicon), a dielectric layer 412 (e.g., oxide), and a channel layer material 406 (e.g., undoped polysilicon) may be deposited within the memory hole and arranged in order to form the inverted NAND string. As depicted in FIG. 4A, the tunneling layer material 408 is arranged within or inside of the memory hole. The tunneling layer material 408 may comprise a portion of a multi-layer dielectric stack such as an ONO dielectric stack, which includes alternating layers of silicon dioxide ("O") and silicon nitride ("N"). In some cases, the tunneling layer material 408 may comprise a high-K dielectric material (e.g., hafnium-based high-K dielectrics or hafnium oxide) that has a dielectric constant that is greater than that of silicon dioxide. In some cases, a core material layer 404 (e.g., oxide) may be formed within the memory hole. In other cases, the core material layer 404 may be omitted. A bit line contact layer 402 may be formed at the top of the memory hole and connect to or directly abut the channel layer material 406. The channel layer material 406 may connect to the source line layer 422 at the bottom of the memory hole. Thus, in this case, the bit line contact layer 402 connects to the inverted NAND string at the top of the memory hole and the source line contact layer 422 connects to the inverted NAND string at the bottom of the memory hole.

In one embodiment, the bit line contact layer 402 may comprise a material of a first conductivity type (e.g., n-type) and the source line contact layer 422 may comprise a material of a second conductivity type different from the first conductivity type (e.g., p-type). In one example, the bit line contact layer 402 may comprise an n-type material (e.g., n-type polysilicon) and the source line contact layer 422 may comprise a p-type material (e.g., p-type polysilicon). In another example, the bit line contact layer 402 may comprise a p-type material and the source line contact layer 422 may comprise an n-type material (e.g., n-type polysilicon). Thus, in some cases, the inverted NAND string may include an asymmetric source and drain that may be used to provide both an electron supply (via the n-type material) and a hole supply (via the p-type material) for memory operations (e.g., program, erase, and read operations) performed using the inverted NAND string. The memory operations may comprise n-channel operations and/or p-channel operations depending on the bias conditions applied to the inverted NAND string.

In one embodiment, an inverted NAND string may be formed using a core material layer (e.g., an oxide layer or other dielectric layer) that is arranged adjacent to a channel layer (e.g., an undoped polysilicon channel layer) that is arranged adjacent to a blocking layer (e.g., an oxide layer or other dielectric layer) that is arranged adjacent to a floating gate layer (or a charge trap layer) that is arranged adjacent to a tunneling layer (e.g., a thin oxide) that is arranged adjacent to a control gate layer (e.g., tungsten). The tunneling layer may have a thickness that is less than the thickness of the blocking layer.

Figure 4B:
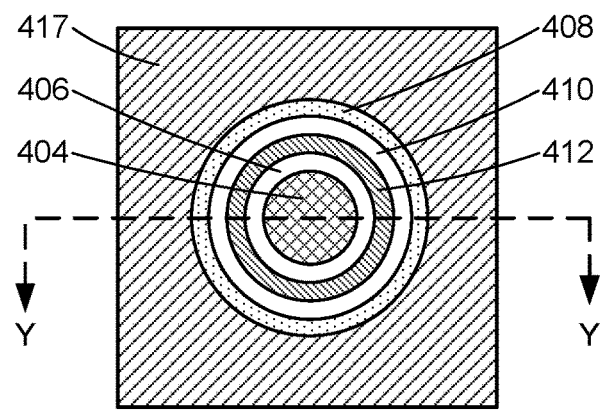
FIG. 4B depicts one embodiment of a cross-sectional view taken along line X-X of FIG. 4A.

FIG. 4B depicts one embodiment of a cross-sectional view taken along line X-X of FIG. 4A. As depicted, the inverted NAND string includes an inner core material layer 404 that is surrounded by the channel layer material 406 that is surrounded by the dielectric layer 412 that is surrounded by the floating gate material 410 that is surrounded by the tunneling layer material 408 that is surrounded by the control gate material layer 417. In one embodiment, FIG. 4A may depict a cross-sectional view taken along line Y-Y of FIG. 4B. In one embodiment, the inverted NAND string may be formed using a vertical cylindrical structure or a vertical tapered cylindrical structure. In this case, the dielectric material 412, floating gate material 410, tunneling layer material 408, and channel layer material 406 of the inverted NAND string may comprise vertical annular structures surrounding the core material layer 404. In another embodiment, the inverted NAND string may be formed using a vertical pillar structure or a vertical rectangular prism structure.

In some embodiments, a vertical NAND structure may include a vertical NAND string formed above a substrate and oriented such that the vertical NAND string is orthogonal to the substrate. The vertical NAND string may be arranged within a vertical memory hole that is etched through alternating layers of control gate material (e.g., tungsten or polysilicon) and inter-gate insulator material (e.g., oxide or silicon oxide).

Figure 5A:
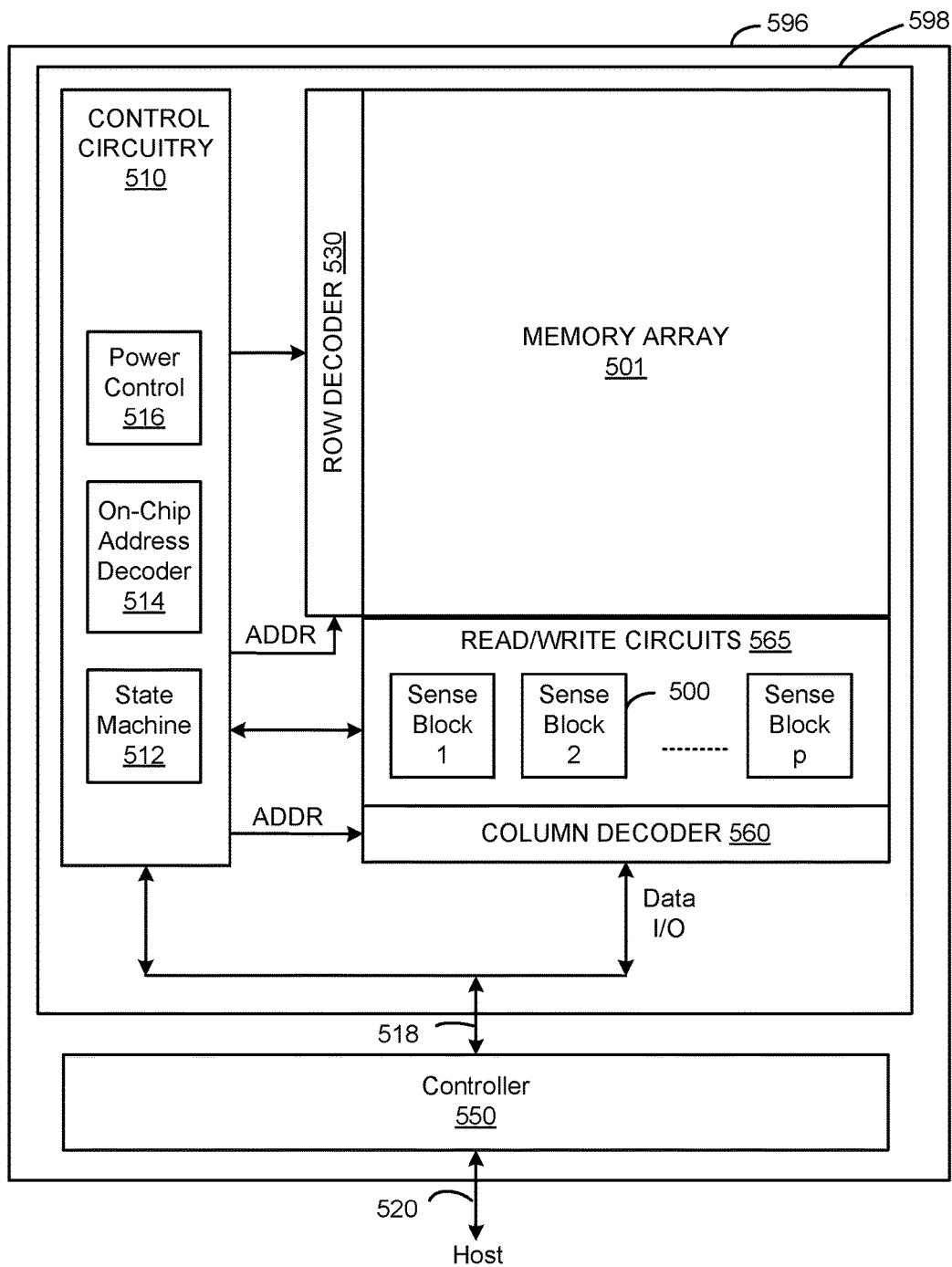
FIG. 5A depicts one embodiment of a non-volatile storage system.

FIG. 5A depicts one embodiment of a non-volatile storage system 596 including read/write circuits for reading and programming a page (or other unit) of memory cells (e.g., NAND multi-level cells) in parallel. As depicted, non-volatile storage system 596 includes a memory die 598 and controller 550. Memory die 598 includes a memory array 501 (e.g., a NAND flash memory array), control circuitry 510, row decoder 530, column decoder 560, and read/write circuits 565. In one embodiment, access to the memory array 501 by the various peripheral circuits (e.g., row decoders or column decoders) is implemented in a symmetric fashion, on opposite sides of the array, so that the densities of access lines and circuitry on each side are reduced by half. The memory array 501 is addressable by word lines via a row decoder 530 and by bit lines via a column decoder 560. Word lines and bit lines are examples of memory array control lines. The read/write circuits 565 include multiple sense blocks 500 that allow a page of storage elements to be read or programmed in parallel. In some cases, controller 550 may be integrated on the memory die 598. Commands and data are transferred between the host and controller 550 via lines 520 and between the controller 550 and the memory die 598 via lines 518.

The control circuitry 510 cooperates with the read/write circuits 565 to perform memory operations on the memory array 501. The control circuitry 510 includes a state machine 512, an on-chip address decoder 514, and a power control module 516. The state machine 512 provides chip-level control of memory operations. The on-chip address decoder 514 provides an address interface between the addresses used by the host and the hardware addresses used by the decoders 530 and 560. The power control module 516 controls the power and voltages supplied to the word lines and bit lines during memory operations. In one embodiment, a power control module 516 includes one or more charge pumps that may generate voltages greater than the supply voltage.

In some embodiments, one or more of the components (alone or in combination), other than memory array 501, may be referred to as a managing or control circuit. For example, one or more managing or control circuits may include any one of or a combination of control circuitry 510, state machine 512, decoders 530/560, power control 516, sense blocks 500, read/write circuits 565, controller 550, and so forth. The one or more managing circuits or the one or more control circuits may perform or facilitate one or more memory array operations including erasing, programming, or reading operations.

In some embodiments, one or more managing or control circuits may be used for controlling the operation of a memory array, such as memory array 501. The one or more managing or control circuits may provide control signals to the memory array in order to perform a read operation and/or a write operation on the memory array. In one example, the one or more managing or control circuits may include any one of or a combination of control circuitry, state machine, decoders, sense amplifiers, read/write circuits, and/or controllers. The one or more control circuits may enable or facilitate one or more memory array operations including erasing, programming, or reading operations to be performed on the memory array. In one example, the one or more control circuits may comprise an on-chip memory controller for determining row and column addresses, word line and bit line addresses, memory array enable signals, and/or data latching signals.

In one embodiment, memory array 501 may be divided into a large number of blocks (e.g., blocks 0-1023, or another amount) of memory cells. As is common for flash memory systems, the block may be the unit of erase. That is, each block may contain the minimum number of memory cells that are erased together. Other units of erase can also be used. A block contains a set of NAND strings which are accessed via bit lines and word lines. Typically, all of the NAND strings in a block share a common set of word lines.

Each block may be divided into a particular number of pages. In one embodiment, a page may be the unit of programming. Other units of programming can also be used. One or more pages of data are typically stored in one row of memory cells. For example, one or more pages of data may be stored in memory cells connected to a common word line. In one embodiment, the set of memory cells that are connected to a common word line are programmed simultaneously. A page can store one or more sectors. A sector may include user data and overhead data (also called system data). Overhead data typically includes header information and Error Correction Codes (ECC) that have been calculated from the user data of the sector. The controller (or other component) calculates the ECC when data is being programmed into the array, and also checks it when data is being read from the array. Alternatively, the ECC and/or other overhead data may be stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks, pages, and sectors can also be used.

Figure 5B:
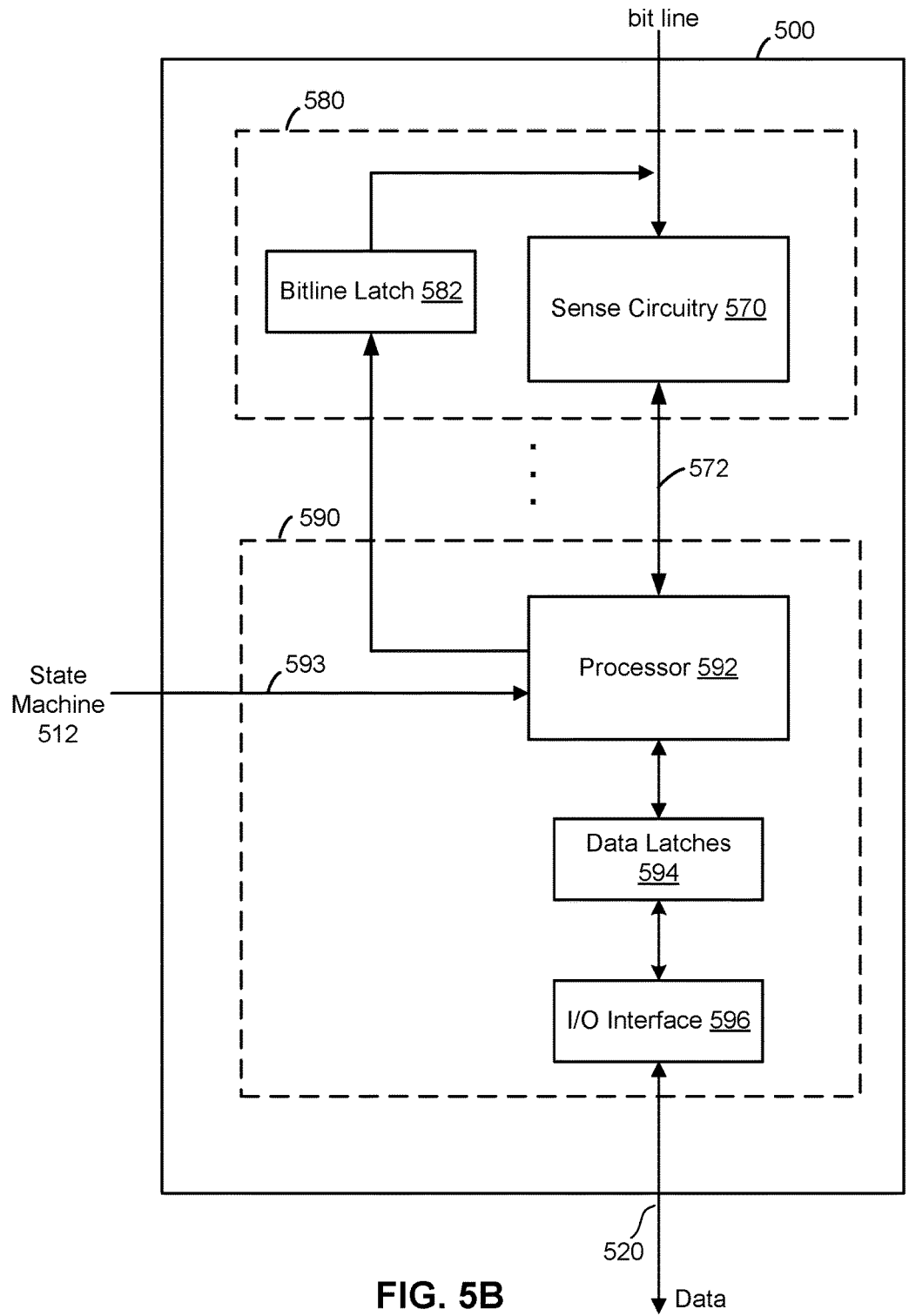
FIG. 5B depicts one embodiment of a sense block.

FIG. 5B depicts one embodiment of a sense block 500, such as sense block 500 in FIG. 5A. An individual sense block 500 may be partitioned into a core portion, referred to as a sense module 580, and a common portion 590. In one embodiment, there is a separate sense module 580 for each bit line and one common portion 590 for a set of multiple sense modules 580. In one example, a sense block will include one common portion 590 and eight sense modules 580. Each of the sense modules in a group will communicate with the associated common portion via a data bus 572.

Sense module 580 comprises sense circuitry 570 that determines whether a conduction current in a connected bit line is above or below a predetermined threshold level. Sense module 580 also includes a bit line latch 582 that is used to set a voltage condition on the connected bit line. For example, a predetermined state latched in bit line latch 582 may result in the connected bit line being pulled to a state designating program inhibit voltage (e.g., 1.5-3 V).

Common portion 590 comprises a processor 592, a set of data latches 594, and an I/O Interface 596 coupled between the set of data latches 594 and data bus 520. Processor 592 performs computations. For example, processor 592 may determine the data stored in the sensed storage element and store the determined data in the set of data latches. The set of data latches 594 may be used to store data bits determined by processor 592 during a read operation or to store data bits imported from the data bus 520 during a program operation. The imported data bits represent write data meant to be programmed into a memory array, such as memory array 501 in FIG. 5A. I/O interface 596 provides an interface between data latches 594 and the data bus 520.

During a read operation or other storage element sensing operation, a state machine, such as state machine 512 in FIG. 5A, controls the supply of different control gate voltages to the addressed storage elements. As it steps through the various predefined control gate voltages corresponding to the various memory states supported by the memory, the sense module 580 may trip at one of these voltages and an output will be provided from sense module 580 to processor 592 via bus 572. At that point, processor 592 determines the resultant memory state by consideration of the tripping event(s) of the sense module and the information about the applied control gate voltage from the state machine via input lines 593. It then computes a binary encoding for the memory state and stores the resultant data bits into data latches 594. In another embodiment of the core portion, bit line latch 582 serves both as a latch for latching the output of the sense module 580 and as a bit line latch as described above.

During a programming operation, the data to be programmed is stored in the set of data latches 594. The programming operation, under the control of the state machine 512, comprises a series of programming voltage pulses applied to the control gates of the addressed storage elements. Each program pulse is followed by a read back (or verify process) to determine if the storage element has been programmed to the desired memory state. Processor 592 monitors the read back memory state relative to the desired memory state. When the two are in agreement, the processor 592 sets the bit line latch 582 so as to cause the bit line to be pulled to a state designating program inhibit voltage. This inhibits the storage element coupled to the bit line from further programming even if program pulses appear on its control gate. In other embodiments, the processor initially loads the bit line latch 582 and the sense circuitry sets it to an inhibit value during the verify process.

Data latch stack 594 contains a stack of data latches corresponding to the sense module. In one embodiment, there are three data latches per sense module 580. The data latches can be implemented as a shift register so that the parallel data stored therein is converted to serial data for data bus 520, and vice-versa. All the data latches corresponding to a read/write block can be linked together to form a block shift register so that a block of data can be input or output by serial transfer. In particular, the bank of read/write modules may be configured such that each of its set of data latches will shift data in to or out of the data bus in sequence as if they are part of a shift register for the entire read/write block.

In some embodiments, a non-volatile storage system, such as non-volatile storage system 596 in FIG. 5A, may be implemented using an integrated circuit. The integrated circuit may include on-chip circuitry to generate a boosted voltage having a magnitude that is greater than the highest power supply voltage provided to the integrated circuit. The boosted voltage may be used for providing power to portions of the electronic circuitry located on the integrated circuit. The boosted voltage may be generated using an on-chip charge pump system. In some cases, a charge pump system may be used to generate an output voltage that is greater than the highest supply voltage provided to the integrated circuit.

In other cases, a charge pump system may be used to generate an output voltage that is less than the lowest supply voltage provided to the integrated circuit (e.g., a negative charge pump system may generate a voltage that is less than ground or VSS).

Figure 6A:
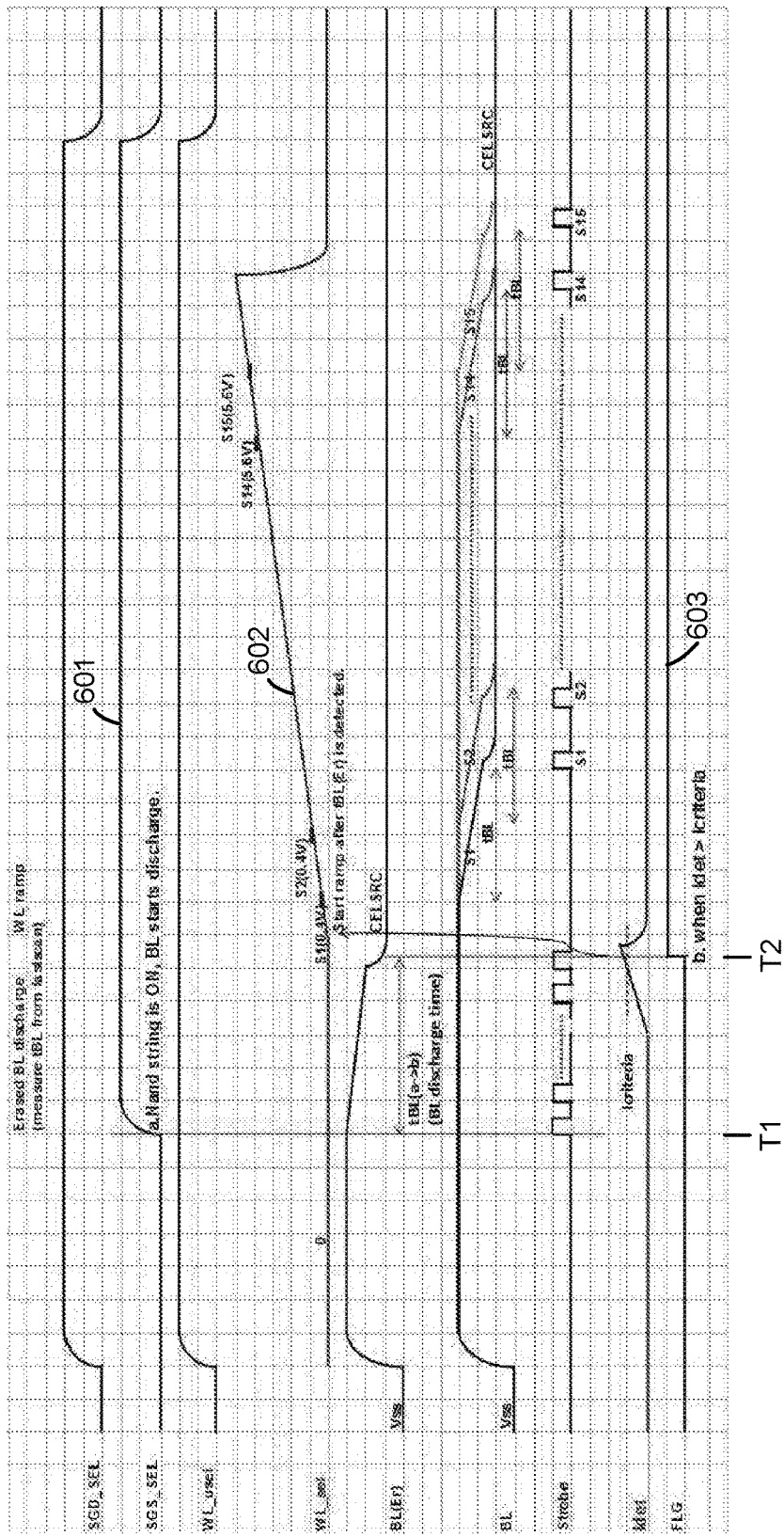
FIG. 6A depicts one embodiment of voltage waveforms applied to a memory array during a memory operation.

FIG. 6A depicts one embodiment of voltage waveforms applied to a memory array during a memory operation. The memory array may include a NAND string. The memory operation may comprise a read operation or a program verify operation. As depicted, at time T1, the SGS_SEL signal 601 applied to an SGS line, such as the SGS line in FIG. 2, is raised from 0V to VDD (e.g., 2.5V). At this point, the NAND string is enabled and may be conducting if a conducting path exists between a bit line connected to the drain-side end of the NAND string and a source line connected to the source-side end of the NAND string. The voltage of a bit line connected to a NAND string with a selected memory cell that is in an erased state BL(ER) begins to discharge at time T1 in response to the SGS_SEL signal rising. After time T1, the strobe signal Strobe toggles and sense amplifiers enable detection currents in response to detecting that selected bit lines connected to the sense amplifiers have fallen below a trigger voltage. Between times T1 and T2, the detection currents may be aggregated and compared with a threshold current. At time T2, a flag signal FLG 603 transitions from 0V to VDD to signal that a threshold current corresponding with a particular number of erased memory cells being sensed as conducting has been met or exceeded. In response to the flag signal FLG 603 transitioning to a high state, the voltage applied to a selected word line of the memory array WL_sel 602 begins ramping from a first voltage (e.g., 0V) to a second voltage (8V).

In one embodiment, the threshold current for determining when the flag signal FLG 603 should transition to a high state may be set based on a chip temperature. In another embodiment, the threshold current for determining when the flag signal FLG 603 should transition to a high state may be set based on a number of bit errors that occurred during a prior sensing operation. For example, during a previous read operation of a page, a bit error or an ECC error may have occurred and the threshold current value may be increased by 2× or 3× in order to compensate for conditions causing the bit error.

Figure 6B:
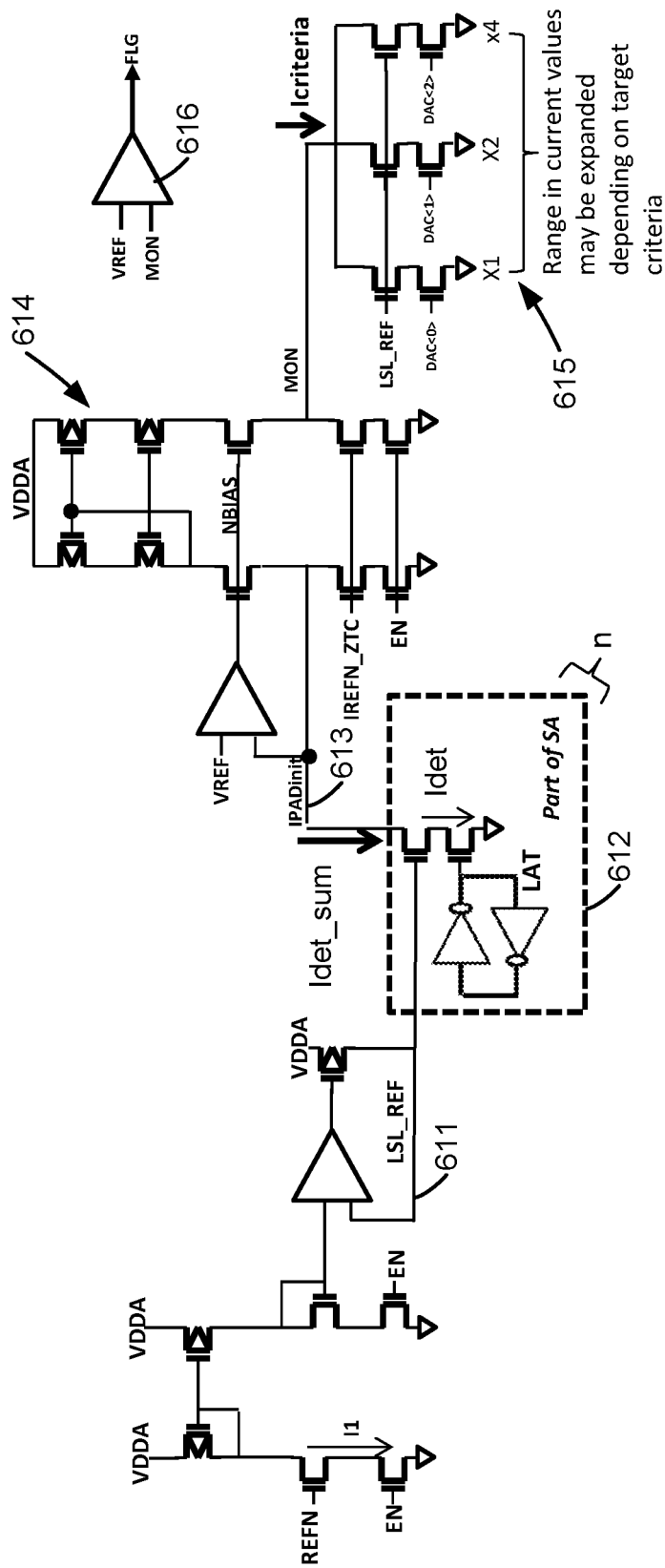
FIG. 6B depicts one embodiment of circuitry for aggregating detection currents from a plurality of sense amplifiers and comparing the aggregated detection currents with a threshold current.

FIG. 6B depicts one embodiment of circuitry for aggregating detection currents from a plurality of sense amplifiers and comparing the aggregated detection currents with a threshold current (e.g., criteria). As depicted, a portion of a sense amplifier 612 includes a latch with an internal node LAT that enables a detection current (Idet) when the internal node is in a high state. The internal node may be set into the high state if a selected memory cell connected to a bit line connected to the sense amplifier is determined to be in a conducting state. The value of the detection current (Idet) may be set via signal LSL_REF 611. The signal LSL_REF may connect to a plurality of sense amplifiers (e.g., n may equal 8K sense amplifiers) in order to set the detection current (Idet) for each of the sense amplifiers. The detection currents may be summed or aggregated at node IPADinit 613 using a wired-OR configuration. The sum of the detection currents Idet_sum may be mirrored to node MON via the current mirror 614. An adjustable current reference 615 may be used to draw a current from the node MON equal to a threshold current (Icriteria). In some cases, the signal LSL_REF may be used to bias fingers of the adjustable current reference 615. In one example, a binary weighting may be used to provide currents ranging from a unit current set by LSL_REF to seven times the unit current. The range of current values may be expanded by adding additional fingers. The voltage of the node MON is then compared with a reference voltage VREF using comparator 616 in order to generate a flag signal FLG, such as the flag signal FLG depicted in FIG. 6A.

In one example, the signal LSL_REF may cause the detection current (Idet) to be 1 µA. In the event that 17 sense amplifiers are triggered while a selected word line is set to a voltage for sensing erased memory cells (e.g., set to 0V), then the sum of the detection currents Idet_sum may be 17 µA. The 17 µA may be mirrored to node MON via a current mirror and cause a pull-up current of 17 µA. In the case that the threshold current (Icriteria) is set to 30 µA, then the voltage of node MON may be set to a low voltage less than the reference voltage VREF as the pull-down current of 30 µA is greater than the pull-up current of 17 µA. In the case that the threshold current (Icriteria) is set to 8 µA, then the voltage of node MON may be set to a high voltage greater than the reference voltage VREF as the pull-down current of 8 µA is less than the pull-up current of 17 µA.

In some cases, the circuitry for aggregating detection currents from a plurality of sense amplifiers depicted in FIG. 6B may comprise a representative example of means for summing a first set of detection currents corresponding with a first set of memory cells sensed to be in a conducting state. The circuitry for comparing the aggregated detection currents with a threshold current depicted in FIG. 6B may comprise a representative example of means for detecting that the sum of the first set of detection currents is greater than a threshold current corresponding with a particular number of conducting memory cells.

Figure 6C:
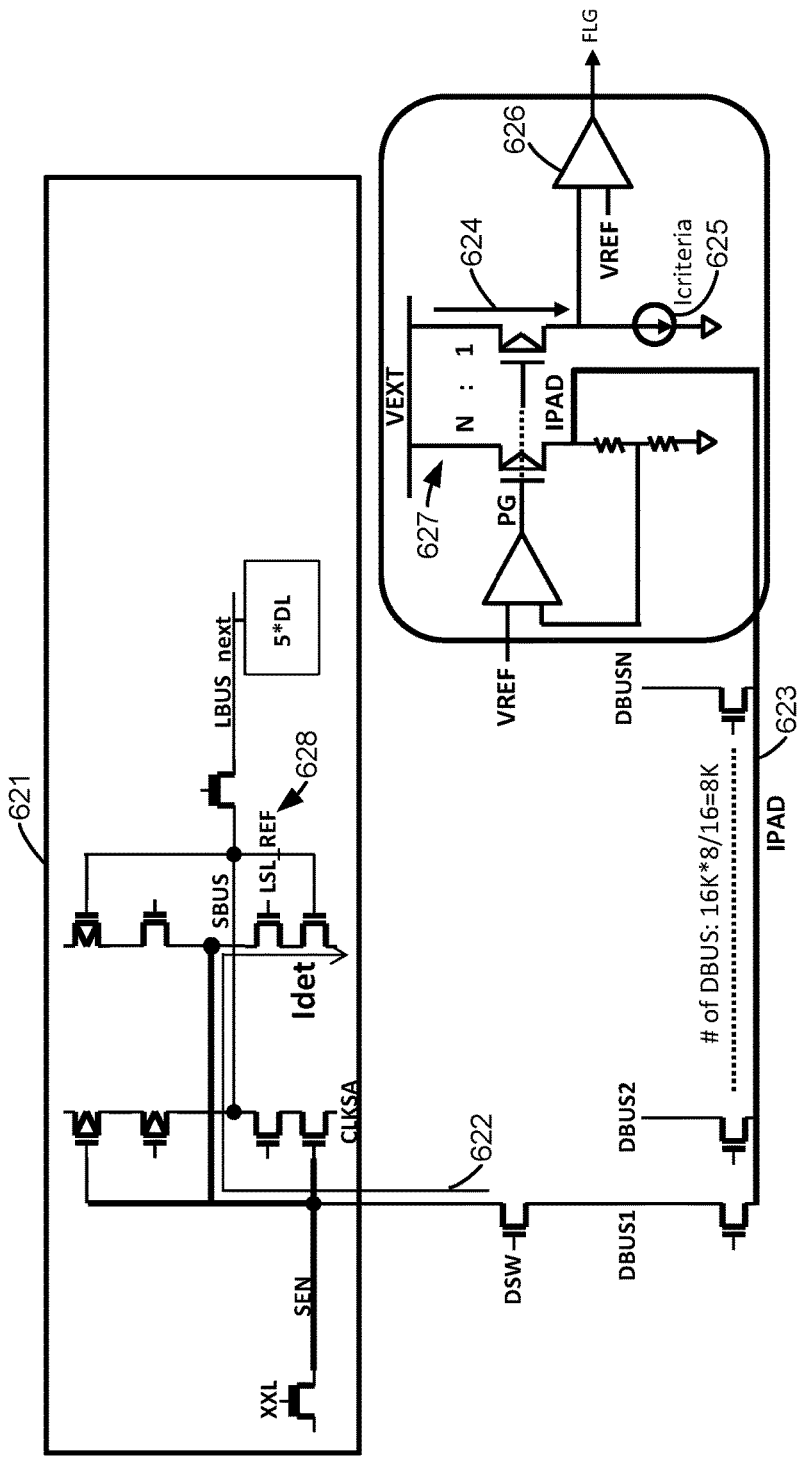
FIG. 6C depicts another embodiment of circuitry for aggregating detection currents from a plurality of sense amplifiers and comparing the aggregated detection currents with a threshold current.

FIG. 6C depicts another embodiment of circuitry for aggregating detection currents from a plurality of sense amplifiers and comparing the aggregated detection currents with a threshold current (e.g., Icriteria). As depicted, a portion of a sense amplifier 621 includes a latch with an internal node SBUS that enables a detection current 622 (Idet) when the internal node is in a high state. The internal node may be set into the high state if a selected memory cell connected to a bit line connected to the sense amplifier is determined to be in a conducting state. The value of the detection current (Idet) may be set via signal LSL_REF 628. The signal LSL_REF 628 may be generated using circuitry such as that shown for generating signal LSL_REF 611 in FIG. 6B. The signal LSL_REF may also connect to a plurality of sense amplifiers not shown (e.g., connect to 8K sense amplifiers) in order to set a uniform detection current (Idet) for each of the sense amplifiers. The detection currents may be summed or aggregated at node IPAD 623 using a wired-OR configuration of 8K wires corresponding with 8K sense amplifiers. The sum of the detection currents may be mirrored to an input of the comparator 626 via the current mirror 627. The current mirror 627 may provide a mirroring ratio of N to 1 such that the output current 624 of the current mirror 627 may be N times less than the sum of the detection currents. An adjustable current reference 625 may be used to draw a current from the input of the comparator 626 equal to a threshold current (Icriteria). The voltage at the input of the comparator 626 is then compared with a reference voltage VREF using the comparator 626 (e.g., comprising a differential amplifier) in order to generate a flag signal FLG, such as the flag signal FLG depicted in FIG. 6A.

In some cases, the circuitry for aggregating detection currents from a plurality of sense amplifiers depicted in FIG. 6C may comprise a representative example of means for summing a first set of detection currents corresponding with a first set of memory cells sensed to be in a conducting state.

The circuitry for comparing the aggregated detection currents with a threshold current depicted in FIG. 6C may comprise a representative example of means for detecting that the sum of the first set of detection currents is greater than a threshold current corresponding with a particular number of conducting memory cells.

Figure 7A:
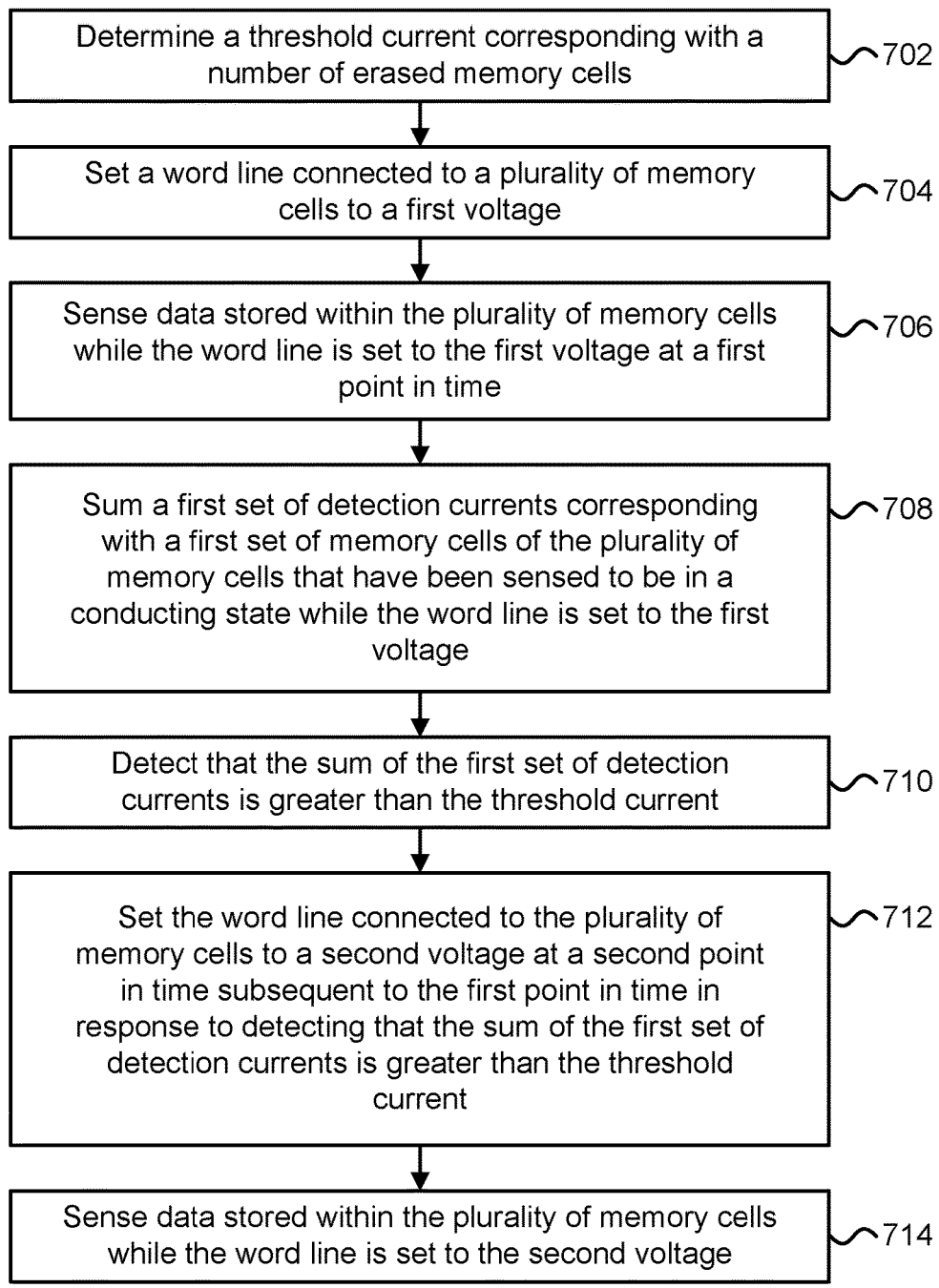
FIG. 7A is a flowchart describing one embodiment of a process for sensing memory cells within a memory array.

FIG. 7A is a flowchart describing one embodiment of a process for sensing memory cells within a memory array. In one embodiment, the process of FIG. 7A may be performed by a non-volatile storage system, such as non-volatile storage system 596 in FIG. 5A.

In step 702, a threshold current corresponding with a number of erased memory cells is determined. In one example, the threshold current may be determined by acquiring a threshold current setting from an on-chip register or from an external source located off-chip. In another example, the threshold current may be determined via control logic or a state machine that determines the threshold current prior to a sensing operation. The threshold current may be set based on a chip temperature and/or a particular number of bit errors that occurred during a prior sensing operation. In one example, if the chip temperature is greater than a temperature threshold (e.g., is above 55 degrees Celsius), then the threshold current may be set to 1 mA; however, if the chip temperature is not greater than the temperature threshold and no bit errors occurred during a prior sensing operation, then the threshold current may be set to 200 μA. In another example, if during a prior sensing operation the number of bit errors was greater than a threshold number of bit errors (e.g., greater than two bit errors) and the chip temperature is greater than a temperature threshold, then the threshold current may be set to 1 mA; however, if during the prior sensing operation the number of bit errors was not greater than the threshold number of bit errors, then the threshold current may be set to 500 μA.

In step 704, a word line connected to a plurality of memory cells is set to a first voltage (e.g., to 0V or to a voltage associated with sensing erased memory cells). In step 706, data stored within the plurality of memory cells is sensed while the word line is set to the first voltage at a first point in time. In step 708, a first set of detection currents corresponding with a first set of memory cells of the plurality of memory cells that have been sensed to be in a conducting state while the word line is set to the first voltage is summed or aggregated. In step 710, it is detected that the sum of the first set of detection currents is greater than the threshold current. In step 712, the word line connected to the plurality of memory cells is set to a second voltage at a second point in time subsequent to the first point in time in response to detecting that the sum of the first set of detection currents is greater than the threshold current. The second voltage (e.g., 5V) may be greater than the first voltage (e.g., 0V). In step 714, data stored within the plurality of memory cells is sensed while the word line is set to the second voltage.

In some embodiments, upon detection that the sum of the first set of detection currents is greater than the threshold current, a flag signal may be generated, such as flag signal FLG 603 in FIG. 6A, to enable the initiation of word line ramp sensing. Once the flag signal has been set, the first set of the detection currents may be disabled in order to reduce power. In one example, the signal LSL_REF 611 in FIG. 6B may be set to 0V to disable the detection currents through the sense amplifiers.

In some embodiments, upon detection that the sum of the first set of detection currents is greater than the threshold current, the voltage applied to a selected control line (e.g., a selected word line or selected bit line) may be adjusted (e.g., increased or decreased). In one example, upon detection that the sum of the first set of detection currents is greater than the threshold current, a selected bit line connected to a ReRAM memory cell may be increased in order to perform a sensing operation corresponding with a higher programmed data state. In another example, upon detection that the sum of the first set of detection currents is greater than the threshold current, a selected word line connected to a memory cell may be decreased (e.g., a negative word line slope).

Figure 7B:
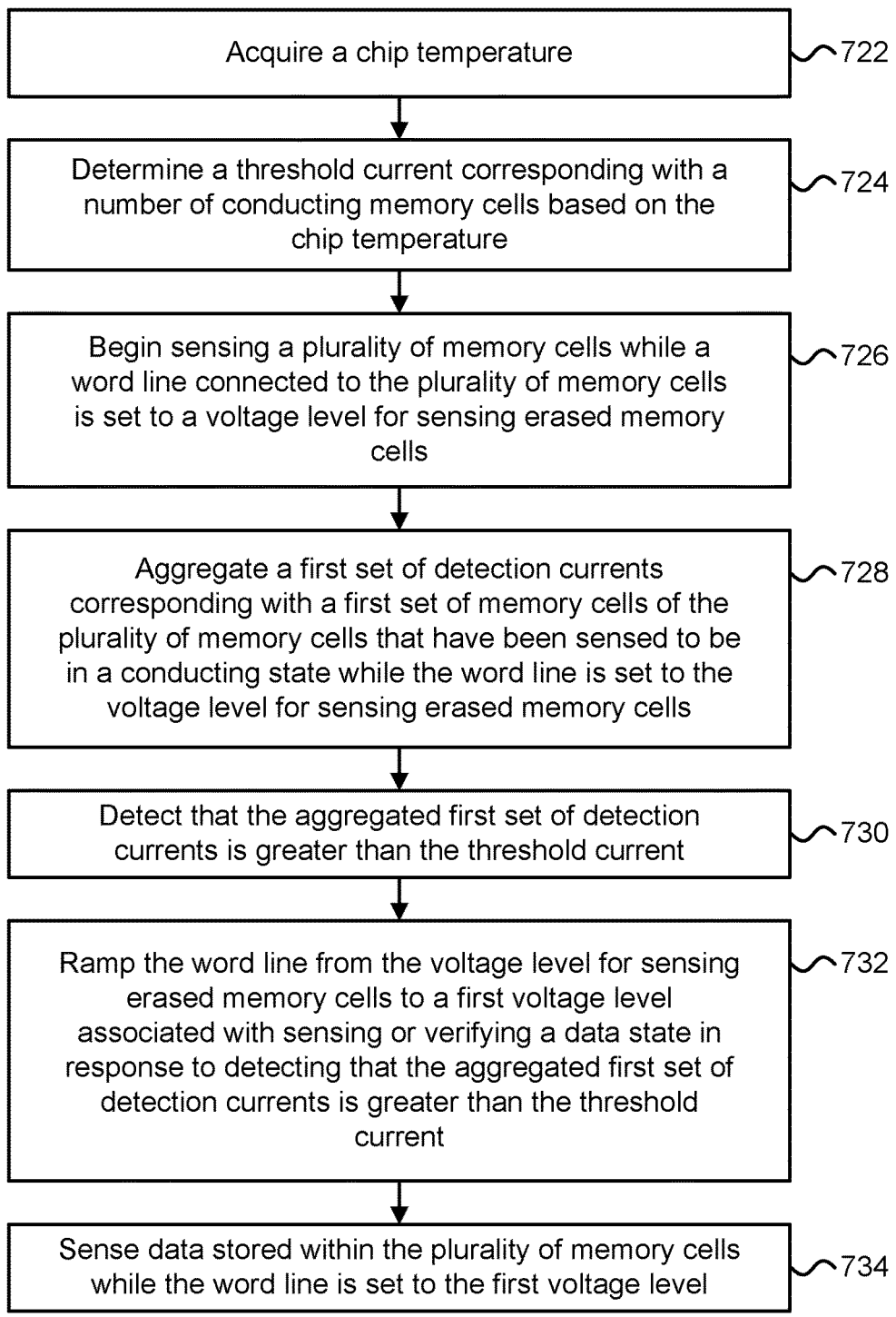
FIG. 7B is a flowchart describing an alternative embodiment of a process for sensing memory cells within a memory array.

FIG. 7B is a flowchart describing one embodiment of a process for sensing memory cells within a memory array. In one embodiment, the process of FIG. 7B may be performed by a non-volatile storage system, such as non-volatile storage system 596 in FIG. 5A.

In step 722, a chip temperature is acquired. The chip temperature may be acquired via a temperature sensor. In step 724, a threshold current corresponding with a number of conducting memory cells is determined based on the chip temperature. In step 726, sensing of a plurality of memory cells while a word line connected to the plurality of memory cells is set to a voltage level for sensing erased memory cells is begun or initiated. In step 728, a first set of detection currents corresponding with a first set of memory cells of the plurality of memory cells that have been sensed to be in a conducting state while the word line is set to the voltage level for sensing erased memory cells is aggregated. In step 730, it is detected that the aggregated first set of detection currents is greater than the threshold current. In step 732, the word line is ramped from the voltage level for sensing erased memory cells to a first voltage level associated with sensing or verifying a data state different from the erased data state in response to detecting that the aggregated first set of detection currents is greater than the threshold current. In step 734, data stored within the plurality of memory cells is sensed while the word line is set to the first voltage level.

In an alternative embodiment, a control circuit may set a selected word line to a first voltage associated with sensing a first data state (e.g., the erased data state) and aggregate a first set of detection currents from a plurality of sense amplifiers while the selected word line is set to the first voltage. In response to detecting that the sum of the first set of detection currents is greater than a threshold current, the control circuit may set the selected word line to a second voltage associated with sensing a second data state (e.g., the A-state) and disable a first set of sense amplifiers associated with the first set of the detection currents. While the selected word line is set to the second voltage, a second set of detection currents may be aggregated from the plurality of sense amplifiers. In response to detecting that the sum of the second set of detection currents is greater than the threshold current, the control circuit may set the selected word line to a third voltage associated with sensing a third data state (e.g., the B-state) and disable a second set of sense amplifiers associated with the second set of the detection currents. Therefore, in some cases, the voltage applied to the selected word line may be adjusted (e.g., increased) in response to detecting that a particular number of memory cells programmed to a particular data state have been sensed to be in a conducting state.

One embodiment of the disclosed technology includes a memory array and a control circuit. The memory array including a plurality of memory cells connected to a word line. The control circuit configured to determine a threshold current corresponding with a number of erased memory cells and sum a first set of detection currents corresponding with a first set of memory cells of the plurality of memory cells that have been sensed to be in a conducting state. The control circuit configured to increase a voltage applied to the word line in response to detecting that the sum of the first set of detection currents is greater than the threshold current.

One embodiment of the disclosed technology includes determining a threshold current corresponding with a number of conducting memory cells, setting a word line connected to a plurality of memory cells to a first voltage, summing a first set of detection currents corresponding with a first set of memory cells of the plurality of memory cells that have been sensed to be in a conducting state while the word line is set to the first voltage, and setting the word line to a second voltage greater than the first voltage in response to detecting that the sum of the first set of detection currents is greater than the threshold current.

One embodiment of the disclosed technology includes a plurality of memory cells and a control circuit. The plurality of memory cells connected to a word line. The control circuit configured to acquire a number of bit errors that occurred during a prior sensing of the plurality of memory cells and determine a threshold current based on the number of bit errors. The control circuit configured to aggregate a first set of detection currents corresponding with a first set of memory cells of the plurality of memory cells that have been sensed to be in a conducting state and initiate a voltage ramp applied to the word line in response to detecting that the aggregation of the first set of detection currents is greater than the threshold current.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments and do not necessarily refer to the same embodiment.

For purposes of this document, a connection may be a direct connection or an indirect connection (e.g., via another part). In some cases, when an element is referred to as being connected or coupled to another element, the element may be directly connected to the other element or indirectly connected to the other element via intervening elements. When an element is referred to as being directly connected to another element, then there are no intervening elements between the element and the other element.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus, comprising:
a memory array including a plurality of memory cells connected to a control line; and
a control circuit configured to acquire a threshold current corresponding with a number of memory cells in a conducting state and sum a first set of detection currents corresponding with a first set of memory cells of the plurality of memory cells sensed to be in a conducting state, the control circuit configured to delay a ramping in a voltage applied to the control line until detection that the sum of the first set of detection currents is greater than the threshold current, the control line comprises a word line.

2. The apparatus of claim 1, wherein:
the control circuit configured to increase the voltage applied to the word line using a word line voltage ramp.

3. The apparatus of claim 2, wherein:
the control circuit configured to increase the voltage applied to the word line using a word line voltage ramp from a first voltage to a second voltage greater than the first voltage in response to detecting that the sum of the first set of detection currents is greater than the threshold current.

4. The apparatus of claim 1, wherein:
the control circuit configured to determine the threshold current based on a number of bit errors that occurred during a prior sensing of the plurality of memory cells.

5. The apparatus of claim 1, wherein:
the control circuit configured to determine the threshold current based on a chip temperature.

6. The apparatus of claim 1, wherein:
the control circuit configured to set the control line to a first voltage and sum the first set of detection currents while the control line is set to the first voltage.

7. The apparatus of claim 6, wherein:
the first voltage corresponds with a voltage level for sensing erased memory cells.

8. The apparatus of claim 1, wherein:
the control circuit configured to perform a read operation while the first set of detection currents is summed.

9. The apparatus of claim 1, wherein:
the control circuit configured to perform a program verify operation while the first set of detection currents is summed.

10. The apparatus of claim 1, wherein:
the memory array comprises a three-dimensional memory array.

11. The apparatus of claim 1, wherein:
the memory array comprises a non-volatile memory that is monolithically formed in one or more physical levels of memory cells having active areas disposed above a silicon substrate.

12. A method, comprising:
determining a threshold current corresponding with a number of conducting memory cells;
setting a word line connected to a plurality of memory cells to a first voltage;
summing a first set of detection currents corresponding with a first set of memory cells of the plurality of memory cells that have been sensed to be in a conducting state while the word line is set to the first voltage; and
delaying a ramping of the word line to a second voltage greater than the first voltage in response to detecting that the sum of the first set of detection currents is greater than the threshold current.

13. The method of claim 12, further comprising:
determining the threshold current based on a number of bit errors that occurred during a prior sensing of the plurality of memory cells.

14. The method of claim 12, further comprising:
determining the threshold current based on a chip temperature.

15. The method of claim 12, wherein:
the ramping of the word line to the second voltage greater than the first voltage includes increasing a voltage applied to the word line.

16. The method of claim 15, wherein:
the first voltage corresponds with a first voltage level for sensing an erased data state; and
the second voltage corresponds with a second voltage level for sensing a data state different from the erased data state.

17. The method of claim 12, further comprising:
sensing a second set of memory cells of the plurality of memory cells different from the first set of memory cells while the word line is set to the second voltage.

18. The method of claim 12, further comprising:
performing a read operation on the plurality of memory cells while the first set of detection currents is summed.

19. An apparatus, comprising:
a plurality of memory cells connected to a word line; and
a control circuit configured to determine a threshold current corresponding with a number of erased memory cells and sum a first set of detection currents corresponding with a first set of memory cells of the plurality of memory cells sensed to be in a conducting state, the control circuit configured to delay a ramping in a voltage applied to the word line until detection that the sum of the first set of detection currents is greater than the threshold current.

20. The apparatus of claim 19, wherein:
the control circuit configured to determine the threshold current based on a number of bit errors that occurred during a prior sensing of the plurality of memory cells; and
the plurality of memory cells comprise ReRAM memory cells.

21. A system, comprising:
a plurality of memory cells connected to a word line;
means for summing a first set of detection currents corresponding with a first set of memory cells of the plurality of memory cells sensed to be in a conducting state;
means for detecting that the sum of the first set of detection currents is greater than a threshold current corresponding with a particular number of conducting memory cells; and
a control circuit configured to delay a ramping in a voltage applied to the word line until detection that the sum of the first set of detection currents is greater than the threshold current.

* * * * *